United States Patent
Sato

(10) Patent No.: US 7,648,885 B2
(45) Date of Patent: Jan. 19, 2010

(54) METHOD FOR FORMING MISALIGNMENT INSPECTION MARK AND METHOD FOR MANUFACTURING SEMICONDUCTOR DEVICE

(75) Inventor: Takashi Sato, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 388 days.

(21) Appl. No.: 11/491,302

(22) Filed: Jul. 24, 2006

(65) Prior Publication Data

US 2007/0026543 A1    Feb. 1, 2007

(30) Foreign Application Priority Data

Jul. 25, 2005    (JP)    ............... 2005-214201

(51) Int. Cl.
     *H01L 21/76*    (2006.01)
(52) U.S. Cl. ............... 438/401; 257/E23.179
(58) Field of Classification Search ................ 438/401, 438/462, 975; 257/797, E23.179
See application file for complete search history.

(56) References Cited

U.S. PATENT DOCUMENTS

| | | | |
|---|---|---|---|
| 6,440,616 B1 | 8/2002 | Izuha et al. | |
| 6,610,448 B2 | 8/2003 | Sato et al. | |
| 7,192,845 B2* | 3/2007 | Yen et al. | 438/462 |
| 2002/0155389 A1* | 10/2002 | Rangarajan et al. | 430/314 |
| 2003/0174879 A1* | 9/2003 | Chen | 382/151 |
| 2004/0096755 A1 | 5/2004 | Koike et al. | |
| 2005/0127460 A1 | 6/2005 | Saito | |

FOREIGN PATENT DOCUMENTS

JP    2002-64055    2/2002

* cited by examiner

*Primary Examiner*—Walter L Lindsay, Jr.
*Assistant Examiner*—Reema Patel
(74) *Attorney, Agent, or Firm*—Finnegan, Henderson, Farabow, Garrett & Dunner, L.L.P.

(57) ABSTRACT

A method for forming a misalignment inspection mark is disclosed. The formation method includes forming a reference layer device pattern and a first mark in a reference layer and forming an overlying layer device pattern and a second mark in a layer over the reference layer, the overlying layer device pattern corresponding to the reference layer. The second mark is formed by forming a second mark area adjacent to the first mark, the second mark area including an arrangement of a plurality of patterns having a line width, a pitch, and a pattern density at least one of which is equivalent to that of the overlying layer device pattern, and removing those of the plurality of patterns which are arranged at boundaries of the second mark area.

18 Claims, 12 Drawing Sheets

METHOD FOR FORMING MISALIGNMENT INSPECTION MARK AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2005-214201, filed Jul. 25, 2005, the entire contents of which are incorporated herein by reference.

BACKGROUND OF THE INVENTION

1. Field of the Invention

The present invention relates to a method for forming a misalignment inspection mark that is suitable for inspection of a fine, large-scale semiconductor integrated circuit, as well as a method for manufacturing a semiconductor device.

2. Description of the Related Art

In a process of manufacturing a semiconductor device, to form device patterns for a plurality of mask levels by means of overlay patterning, a plurality of mask patterns are sequentially laid on top of one another on a semiconductor wafer and then exposed. During exposure, misalignment inspections are carried out to prevent a possible open circuit or leakage between the device pattern in a reference layer and the device pattern in the overlying layer. These inspections check whether or not the reference layer device pattern and the overlying layer device patterns lie correctly on top of one another. Thus, in addition to the device patterns, misalignment inspection marks are formed on a semiconductor wafer to inspect the device patterns for misalignment.

For example, in manufacturing a fine, large-scale semiconductor integrated circuit with a minimum processing size F of at most about 100 to 150 nm, a high-level mask processing technique or photolithography technique is essential. In particular, a further reduction in the size of semiconductor integrated circuits increases the size of misalignment inspection marks relative to that of device patterns. This varies the effect of aberration of the optical system of an exposure apparatus, focal distance, or the like, between the misalignment inspection mark and the device pattern. The varying effect of aberration, focal distance, or the like also varies the amount of transfer misalignment between the misalignment inspection mark and device pattern, which are transferred to the semiconductor wafer. Thus, in spite of the minimized amount of misalignment between the misalignment inspection marks, significant alignment errors may disadvantageously occur between the device patterns.

Moreover, in a conventional method of forming misalignment inspection marks larger than the device patterns in width, on the same mask substrate, the device pattern and the inspection mark have different coverages on the substrate. Accordingly, in view of a possible loading effect during a lithography or dry etching process for fine patterns, the misalignment inspection marks do not enable the fluctuation of the process between the device patterns to be precisely evaluated.

Thus, to equalize the amount of transfer misalignment between the misalignment inspection mark and the device pattern to minimize alignment errors between the device patterns, a method has been proposed which uses misalignment inspection marks having the same size, shape, and the like as those of a device pattern (for example, Jpn. Pat. Appln. KOKAI Publication No. 2002-64055).

However, for example, in a semiconductor storage device, a chip area is mostly occupied by a periodically repeated pattern of memory cells. A further reduction in the size of the memory cell pattern allows an increase in the number of elements periodically integrated in a large chip area. Compared to the memory cell pattern, which can be approximated through such an infinite expanse, the misalignment inspection marks simply having the same line width and the like as those of the device pattern do not serve to faithfully reproduce the device pattern.

Specifically, misalignment inspection marks used in a dicing area around the periphery of the chip area may be composed of a set of a plurality of fine patterns locally formed in an area of a finite width. In this case, the periodicity or uniformity of the pattern arrangement is discontinued at the boundaries (edges) of the area occupied by these misalignment inspection marks. Consequently, these misalignment inspection marks are not optically equivalent to the device pattern. The pattern shape of boundaries (edges) of the misalignment inspection marks may be deformed by aberration or the like and become different from that of the device pattern. This may degrade measurement accuracy of misalignment inspections.

BRIEF SUMMARY OF THE INVENTION

A method for forming a misalignment inspection mark according to a first aspect of the present invention comprises:

forming, in a reference layer, a reference layer device pattern and at least one first mark present on the same layer as that of the reference layer device pattern;

forming an overlying layer device pattern and at least one second mark area in a layer over the reference layer adjacent to the at least one first mark, the overlying layer device pattern corresponding to the reference layer, the second mark area being present in the same layer as that of the overlying layer device pattern and including an arrangement of a plurality of patterns having a line width, a pitch, and a pattern density at least one of which is equivalent to that of the overlying layer device pattern; and removing those of the plurality of patterns which are arranged at boundaries of the at least one second mark area and using the remaining patterns to form at least one second mark.

A method for manufacturing a semiconductor device according to a first aspect of the present invention comprises:

forming, in a reference layer on a semiconductor substrate, a reference layer device pattern and at least one first mark present on the same layer as that of the reference layer device pattern;

forming an overlying layer device pattern and at least one second mark area in a layer over the reference layer adjacent to the at least one first mark, the overlying layer device pattern corresponding to the reference layer, the second mark area being present in the same layer as that of the overlying layer device pattern and including an arrangement of a plurality of patterns having a line width, a pitch, and a pattern density at least one of which is equivalent to that of the overlying layer device pattern;

removing those of the plurality of patterns which are arranged at boundaries of the second mark area and using the remaining patterns to form at least one second mark;

using the first and second marks to inspect the reference layer device pattern and the overlying layer device pattern for misalignment; and if the inspection indicates that the amount of misalignment is within an allowable range, advancing to a process of processing a device pattern located over the overlying device pattern.

DETAILED DESCRIPTION OF THE INVENTION

Figure 1:
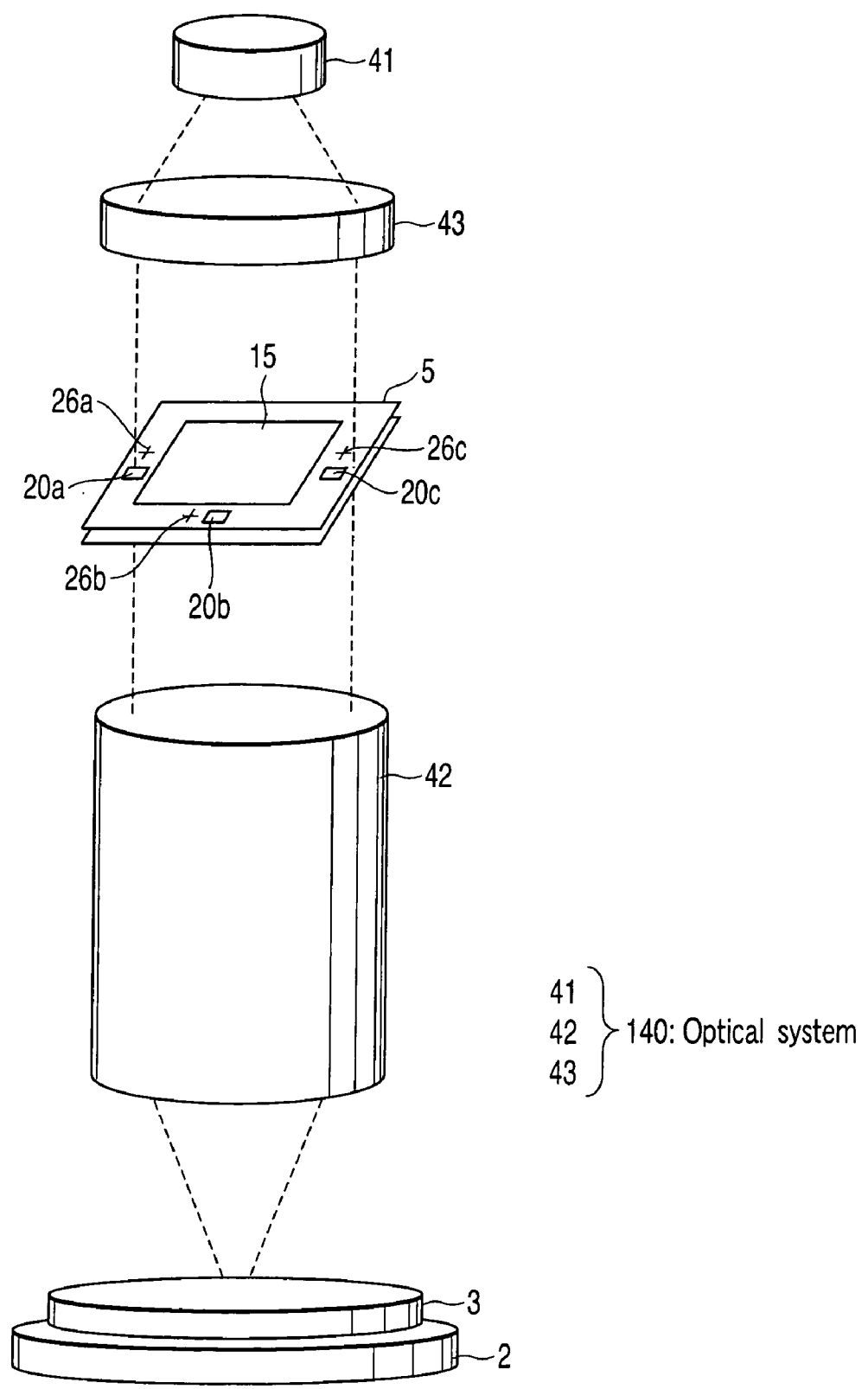
FIG. 1 is a schematic diagram showing a reduced projection exposure apparatus used for a method for forming a misalignment inspection mark according to an embodiment of the present invention.

Now, an embodiment of the present invention will be described with reference to the drawings. In the description of the drawings, the same or similar parts are denoted by the same or similar reference numerals. However, it should be noted that the drawings are schematic and that the sizes and the like of blocks are different from the actual ones. Of course, the drawings contain different dimensional relations or different ratis.

The embodiment shown below is intended to illustrate apparatuses and methods for embodying the technical concept of the present invention. The technical concept of the present invention is not intended to limit the structures, arrangements, and the like of components to those described below. Various changes may be made to the technical concept of the present invention within the scope of the claims.

In a method for forming a misalignment inspection mark according to an embodiment of the present invention, for example, such a reduced projection exposure apparatus as shown in FIG. 1 is used to project the patterns of each misalignment inspection mark on a semiconductor substrate 3 in a reduced form to expose the substrate 3; the reduced projection exposure apparatus comprises an optical system 140 and a stage 2. An optical system in the reduced projection exposure apparatus shown in FIG. 1 comprises an illumination light source 41, a condensing lens 43 placed below the illumination light source 41, and a projection optical system 42 placed below the condensing lens 43. A reticle 5 is placed between the condensing lens 43 and the projection optical system 42. The reticle 5 is irradiated with light from the illuminating light source 41. The reticle 5 comprises a device pattern 15, alignment marks 26a, 26b, and 26c, and misalignment inspection marks 20a, 20b, and 20c all of which receive light condensed by the condensing lens 43. A set of plural reticles 5 is provided so as to be sequentially placed between the condensing lens 43 and the projection optical system 42 in accordance with a series of steps. The semiconductor substrate 3 is placed on a stage 2. Light having passed through the device pattern 15 and misalignment inspection marks 20a, 20b, and 20c is condensed by the projection optical system 42 so as to form an image on the semiconductor substrate 3.

Figure 2:
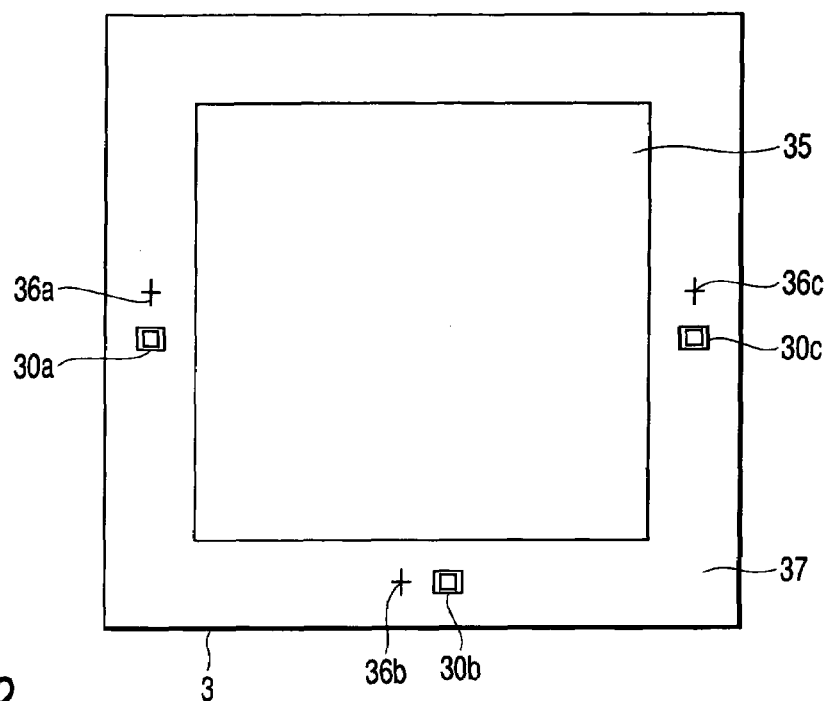
FIG. 2 is a plan view illustrating a chip area as well as misalignment inspection marks and alignment marks provided in a dicing area surrounding the chip area, in the method for forming a misalignment inspection mark according to the embodiment of the present invention.

Such a rectangular chip area as shown in FIG. 2 is placed on the semiconductor substrate 3. A plurality of chip areas are arranged on the semiconductor substrate 3 while being sequentially moved along a matrix in accordance with a step and repeat scheme; the chip areas correspond to a reduced projection image of a pattern formed on the reticle 5. As a result, misalignment inspection marks 30a, 30b, and 30c and alignment marks 36a, 36b, and 36c are arranged on a dicing area 37 surrounding the rectangular chip area; each of the alignment marks 36a, 36b, and 36c is adjacent to the corresponding misalignment inspection mark. The misalignment inspection marks 30a, 30b, and 30c and alignment marks 36a, 36b, and 36c correspond to inspection marks 20a, 20b, and 20c and alignment marks 26a, 26c, and 26c on the reticle 5, shown in FIG. 1. Device patterns 35 for the respective layers are laid on top of one another in the chip area, surrounded by the dicing area 37.

Figure 3:
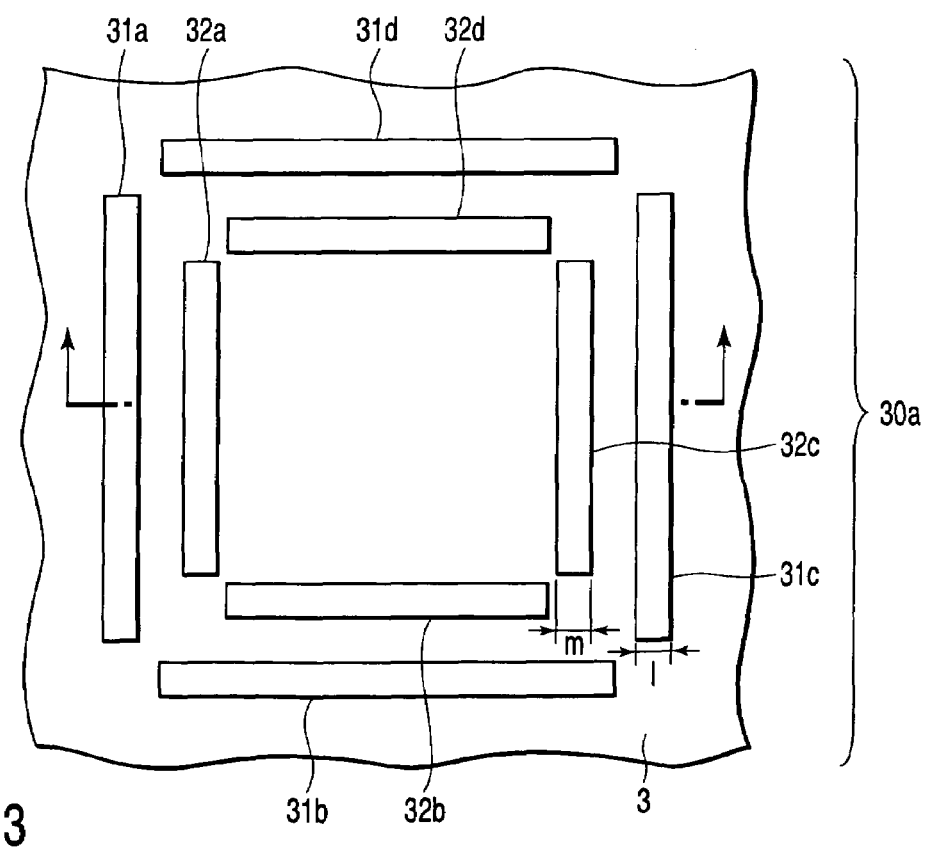
FIG. 3 is an enlarged plan view of the misalignment inspection mark according to the embodiment of the present invention.

FIG. 3 shows an example of an enlarged plan view of the misalignment inspection mark 30a, shown in FIG. 2. The misalignment inspection mark 30a has first marks 31a, 31b, 31c, and 31d and second marks 32a, 32b, 32c, and 32d. The first marks 31a, 31b, 31c, and 31d are arranged so as to form four sides of a square on the surface of the semiconductor substrate 3. The second marks 32a, 32b, 32c, and 32d are arranged inside the square formed of the first marks 31a to 31d. The first marks 31a, 31b, 31c, and 31d correspond to a mask pattern in a reference layer (first layer). The second marks 32a, 32b, and 32c correspond to a mask pattern in a layer (second layer) laid on and aligned with the mask pattern in the reference layer (first layer). The overlying layer (second layer) need not necessarily located immediately above the reference layer (first layer). Another layer may be interposed between the reference layer and the overlying layer. In other words, in the present specification, the reference layer (first layer) and overlying layer (second layer) have only to be two layers in a logically aligned relationship. Such two layers in a logically aligned relationship may involve the physically opposite relationship between the two layers such that the pattern in the overlying layer (second layer) penetrates the reference layer (first layer) as is the case with, for example, via hole patterns.

The width l of the first marks 31a to 31d and the width m of the second marks 32a to 32d may be selected to be, for example, about 2 μm. The second marks (second areas) 32a, 32b, 32c, and 32d are formed to have the same size, pitch (periodicity), and pattern density as those of the device pattern (overlying layer device pattern) 35 in the chip area shown in FIG. 2. Consequently, the second marks 32a, 32b, 32c, and 32d can be formed into a pattern with a line width of, for example, at most about 100 to 150 nm.

Misalignment inspections are carried out by determining the distance (ΔD) between the middle point (M1) of the distance (D1 shown in FIG. 4) between the center of gravity of the first mark 31a and the center of gravity of the first mark 31c and the middle point (M2) of the distance (D2) between the center of gravity of the second mark 32a and the center of gravity of the second mark 32c, and determining the distance between the middle point of the distance between the center of gravity of the first mark 31b and the center of gravity of the first mark 31d and the middle point of the distance between the center of gravity of the second mark 32b and the center of gravity of the second mark 32d; the first marks 31b and 31d are orthogonal to the marks 31a and 31c, and the second marks 32b and 32d are orthogonal to the marks 32a and 32c.

Alternatively, misalignments may be inspected on the basis of the center of gravity C100 of a rectangle formed of the four first marks 31a to 31d, in the present example, a square 100, and the center of gravity C101 of a rectangle formed of the four second marks 32a to 32d, in the present example, a square 101, as shown in FIGS. 17A to 17D.

Figure 17A:
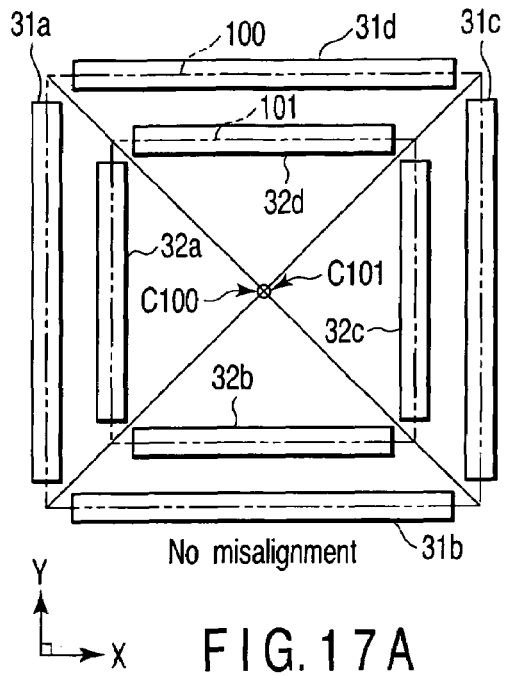
FIGS. 17A, 17B, 17C, and 17D are plan views showing examples of misalignment inspections.

FIG. 17A shows no misalignment between the mask pattern in the reference layer (reference layer device pattern) and the device pattern in the chip area (overlying layer device pattern). In this case, for example, the center of gravity C100 of the square 100 aligns with the center of gravity C101 of the square 101.

Figure 17B:
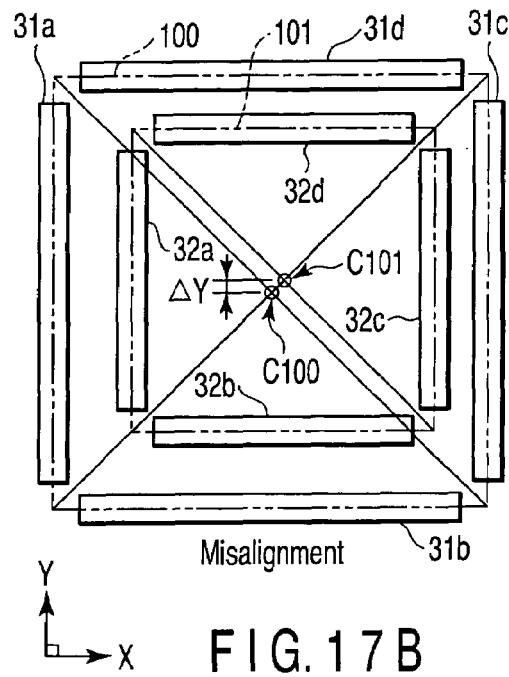
Figure 17C:
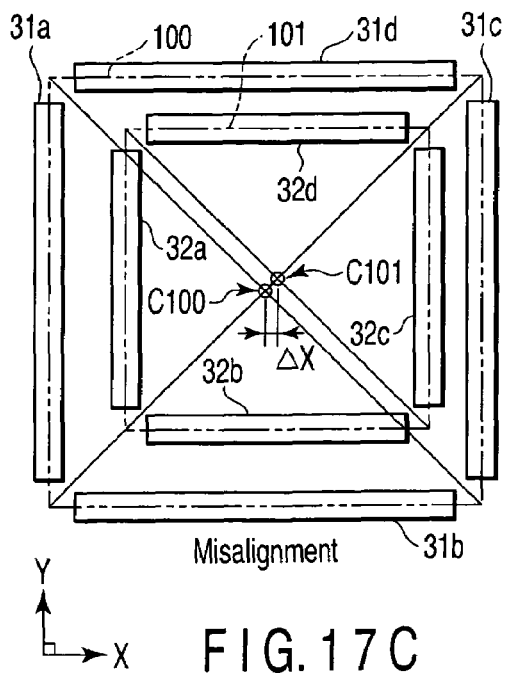
Figure 17D:
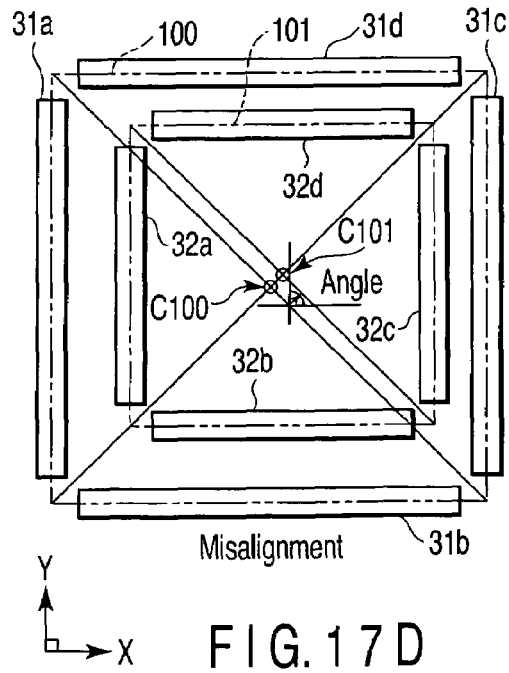

FIGS. 17B to 17D show the case of misalignment between the mask pattern in the reference layer (reference layer device pattern) and the device pattern in the chip area (overlying layer device pattern). In this case, for example, the center of gravity C100 of the square 100 is misaligned with respect to the center of gravity C101 of the square 101. Checking the amount of misalignment enables the determination of the amount of misalignment in a Y direction (FIG. 17B) and an X direction (FIG. 17C), the direction of the misalignment (angle), and the amount of misalignment in that direction (FIG. 17D).

Figure 4:
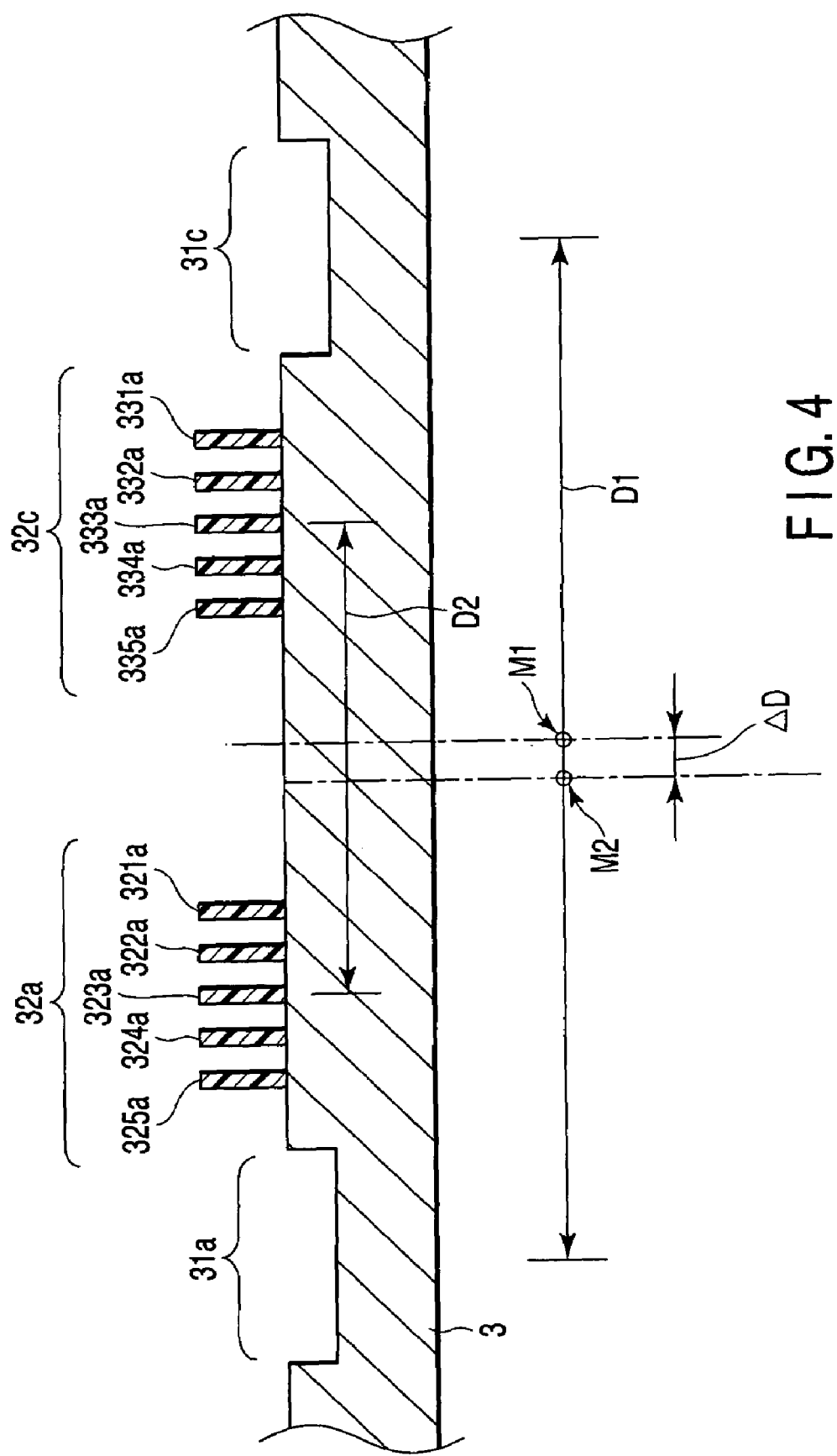
FIG. 4 is a sectional view of the misalignment inspection mark shown in FIG. 3, as viewed from an A-A direction.

The sectional view in FIG. 4 illustrates, for example, grooves formed on the semiconductor substrate 3 by etching, as the first marks 31a and 31c corresponding to the mask pattern in the reference layer (first layer). For example, in the first of a series of at least 100 steps for a complex semiconductor device (semiconductor integrated circuit), grooves may be formed in the surface of the semiconductor substrate 3 and specified as the first marks 31a and 31c. Alternatively, a layer formed during a series of steps such as those described in the flowchart in FIG. 15, described later may be defined as the reference layer (first layer). Another layer in a logically aligned relationship with the above layer may be defined as the overlying layer (second layer). Alternatively, a reference layer (k-th layer) and an overlying layer (k+1-th layer) may be defined (k is an integer equal to or larger than 1). The layer corresponding to a mask pattern used in a later one of the series of steps is defined as a higher mask pattern. In more general, a reference layer (k-th layer) and an overlying layer (k+p-th layer) may be defined (p is an integer equal to or larger than 1).

The second mark (second mark area) 32a, shown in the sectional view in FIG. 4, can be composed of, for example, a plurality of processing patterns 325a, 324a, 323a, 322a, and 321a formed of polycrystalline silicon on the semiconductor substrate 3 via a gate insulating film. In this case, the second mark (second mark area) 32c is similarly composed of a plurality of processing patterns 335a, 334a, 333a, 332a, and 331a formed of polycrystalline silicon on the semiconductor substrate 3 via a gate insulating film.

Figure 5:
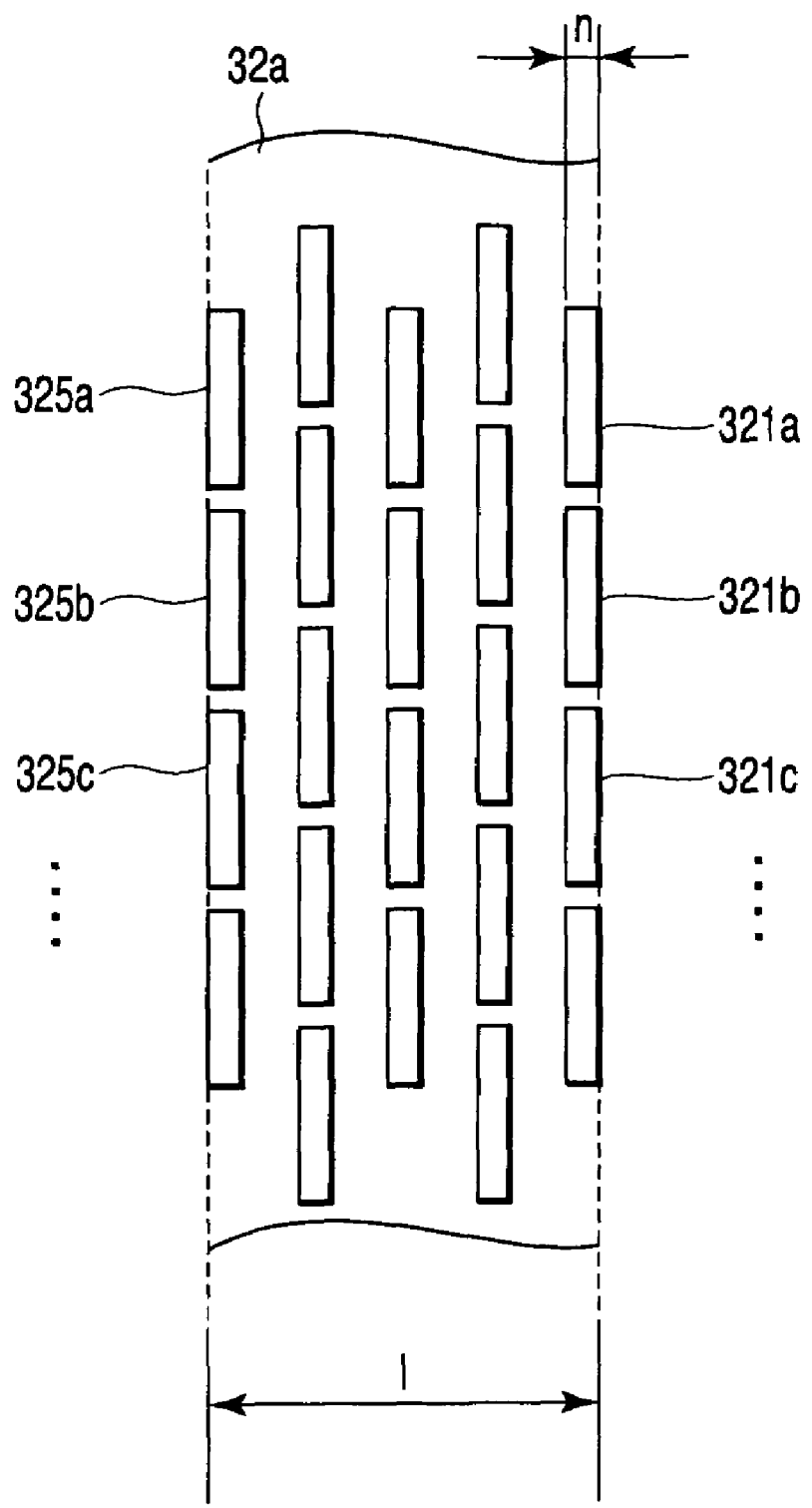
FIG. 5 is a plan view illustrating the periodic arrangement of a plurality of processing patterns constituting a second mark (second mark area) used for the method for forming a misalignment inspection mark according to the embodiment of the present invention.

In the present example, as shown in the plan view in FIG. 5, the second mark (second mark area) 32a is a periodic pattern including processing patterns 321a, 321b, 321c, ..., 325a, 325b, 325c, ... formed in line so as to have the same planar shape. Each of the processing patterns 321a, 321b, 321c, ..., 325a, 325b, 325c, ... has the same line width n as that of the device pattern in FIG. 2. The processing patterns 321a to 325c are formed to have the same length, thickness, arrangement pitch, and pattern density as those of the device pattern 35.

(First Method for Forming a Misalignment Inspection Mark)

With reference to FIGS. 6 to 10, description will be given of a method (first formation method) for forming a misalignment inspection mark according to the embodiment of the present invention. The method for forming a misalignment inspection mark described below is illustrative and not only can be varied as described below but also can be implemented in various other ways. Similarly, the mask pattern disclosed in the description below is illustrative and various other mask patterns can of course be used. In the example described below, a photoresist film (hereinafter simply referred to as a "resist film") is used as a photosensitive film. The photosensitive film may be a film different from the resist film, such as a photosensitive resin film. However, in view of requirements for processing precision, uniformity, and reproducibility, the resist film is preferably used.

Figure 6:
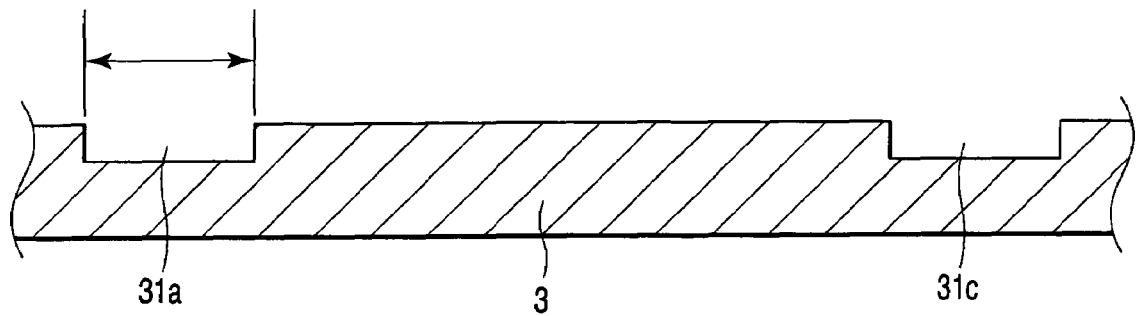
FIG. 6 is a schematic sectional view illustrating a step of a first method for forming a misalignment inspection mark according to the embodiment of the present invention.

(A) A oxide film ($SiO_2$ film) is formed, by a thermal oxidation process, on the surface of the semiconductor substrate (Si substrate) doped with desired impurities. A resist is subsequently coated all over the surface of the oxide film to form a resist film. A photolithography technique is then used to expose and develop the resist film. The resist film is then used as a mask for etching to etch the oxide film by means of a reactive ion etching (RIE) process. A part of the semiconductor substrate 3 is thus selectively exposed. Then, the resist film is removed, and the oxide film is then used as an etching mask to etch the exposed area of the semiconductor substrate 3 by means of the RIE process. After the etching, the oxide film is removed to form groove portions in the reference layer (first layer) which have a depth of, for example, 100 to 300 nm and which constitute the first marks 31a and 31c, as shown in FIG. 6. In a plan view, the reference layer is shaped so that the four separate first marks (groove portions) 31a, 31b, 31c, and 31d surround the rectangular area as shown in FIG. 3. In the chip area shown in FIG. 2, the corresponding reference layer device pattern is formed.

Figure 7:
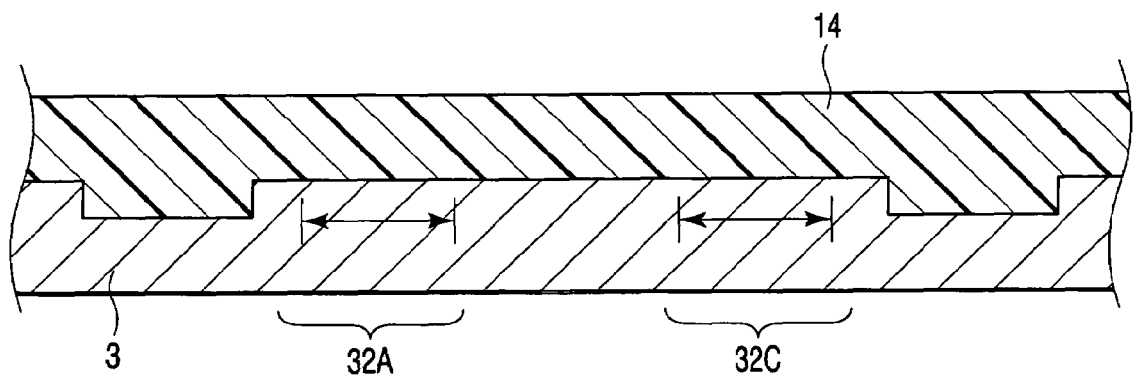
FIG. 7 is a schematic sectional view illustrating a step of the first method for forming a misalignment inspection mark according to the embodiment of the present invention.
Figure 8:
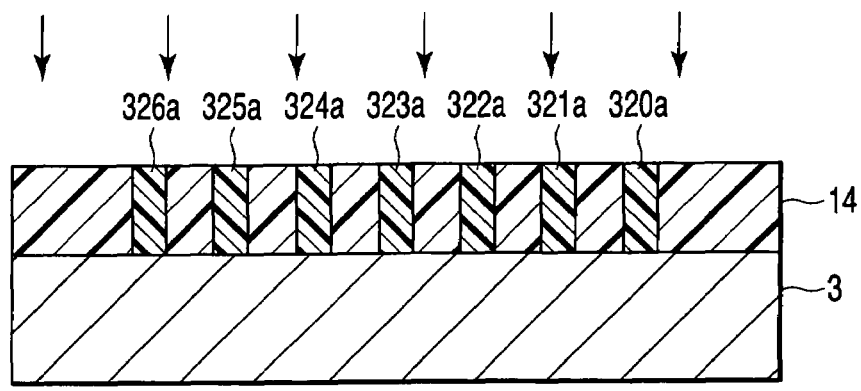
FIG. 8 is a schematic sectional view illustrating a step of the first method for forming a misalignment inspection mark according to the embodiment of the present invention.

(B) Then, as shown in FIG. 7, a resist (positive resist) is spin coated all over the surface of the semiconductor substrate 3 to form a new resist film 14. Then, after a predetermined baking (pre-bake) and cure steps and the like, a first inspection mask (inspection reticle) is used to expose the resist film 14 by projecting the four second mark areas in the overlying layer (second layer), that is, the patterns of the four second marks 32a, 32b, 32c, and 32d (see FIG. 3), on the resist film 14 so that the marks 32a, 32b, 32c, and 32d are reduced and align with the rectangular area surrounded by the four first marks (groove portions) 31a, 31b, 31c, and 31d. Specifically, the patterns of the four second marks (second mark areas) 32a, 32b, 32c, and 32d have the same size, pitch (periodicity), and pattern density as those of the device pattern (overlying layer device pattern) 35 in the chip area shown in FIG. 2. FIG. 8 shows a sectional view of the second mark (second mark area) 32a. However, the four second mark areas need not necessarily have the same size, pitch (periodicity), and pattern density as those of the device pattern 35. At least one of the line width, pitch, and pattern density of the second mark area has only to be equivalent to that of the device pattern 35. Of course, all of the line width, pitch, and pattern density of the second mark area are preferably equivalent to those of the device pattern 35. That is, the first inspection mask (inspection reticle) is used to expose the resist film 14 by projecting the processing patterns 320a, 321a, 322a, . . . , 326a having such a sectional shape as shown in FIG. 8, on the resist film 14 so as to reduce the patterns (first exposure step). The alignment marks 26a, 26b, and 26c, shown in FIGS. 1 and 2, are used for alignment. In FIG. 8, the processing patterns 320a, 321a, 322a, . . . , 326a are unexposed and maintain a molecular structure that is difficult to melt in a developer. All the areas other than the processing patterns 320a, 321a, 322a, . . . , 326a are exposed and subjected to a photolytic reaction, so that their molecular structure is modified to melt in a developer.

Figure 9:
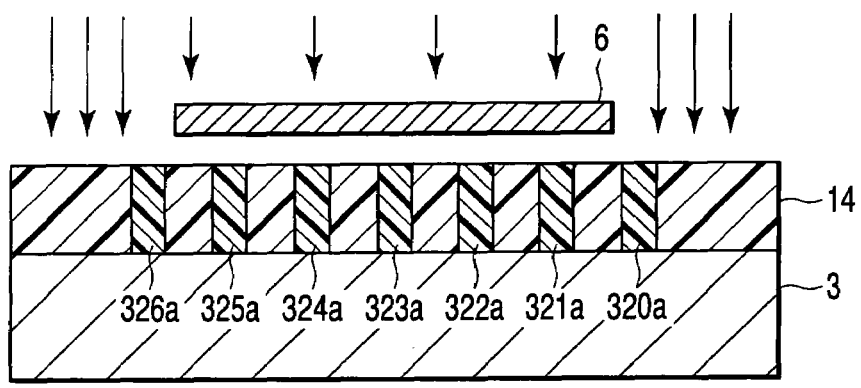
FIG. 9 is a schematic sectional view illustrating a step of the first method for forming a misalignment inspection mark according to the embodiment of the present invention.
Figure 10:
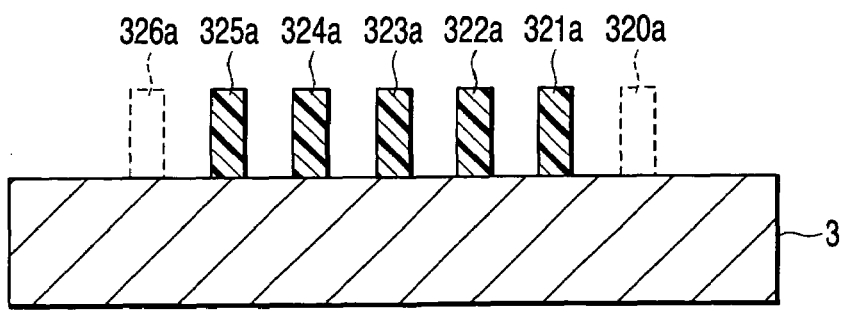
FIG. 10 is a schematic sectional view illustrating a step of the first method for forming a misalignment inspection mark according to the embodiment of the present invention.

(C) A second inspection mask (inspection reticle) is subsequently used to doubly expose the boundaries (edges) of each of the four second marks (second mark areas) 32a, 32b, 32c, and 32d (second exposure step). Description will be given with reference to sectional views of the second mark (second mark area) 32a. As shown in FIG. 9, only the processing patterns 320a and 326a, located at the opposite ends, are selectively doubly exposed. To accomplish this, the second inspection mask (inspection reticle) comprises a mask pattern having a shielding film 6 that avoids exposing the processing patterns 321a, 322a, 323a, 324a, and 324a. The double exposure facilitates the selective photolytic reaction of only the processing patterns 320a and 326a, located at the opposite ends. The molecular structure of the processing patterns 320a and 326a is thus modified to melt in a developer. Thus, the subsequent development process removes the processing patterns 320a and 326a, located at the opposite ends, as shown in FIG. 10.

Figure 18A:
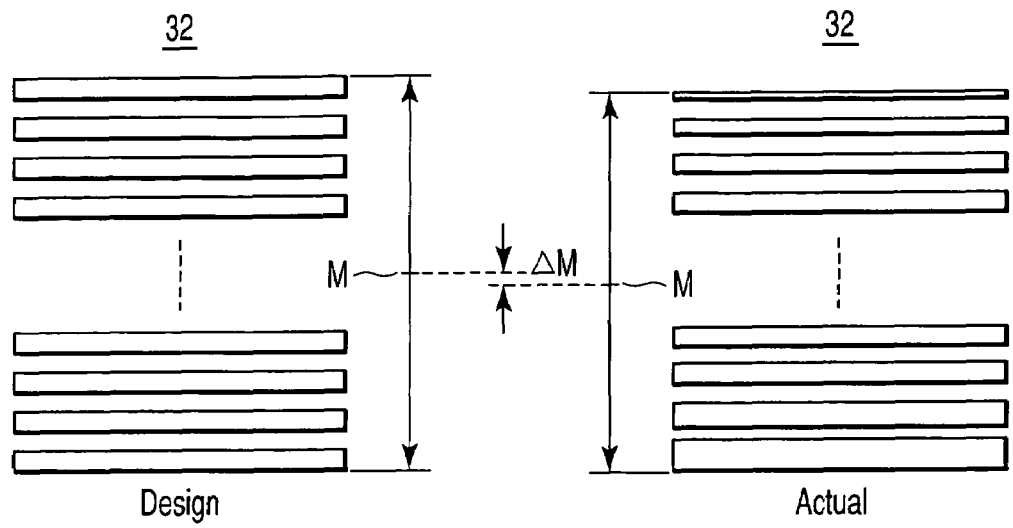
FIGS. 18A and 18B are plan views showing the relationship between a designed center point of a second mark area and an actual center point.
Figure 18B:
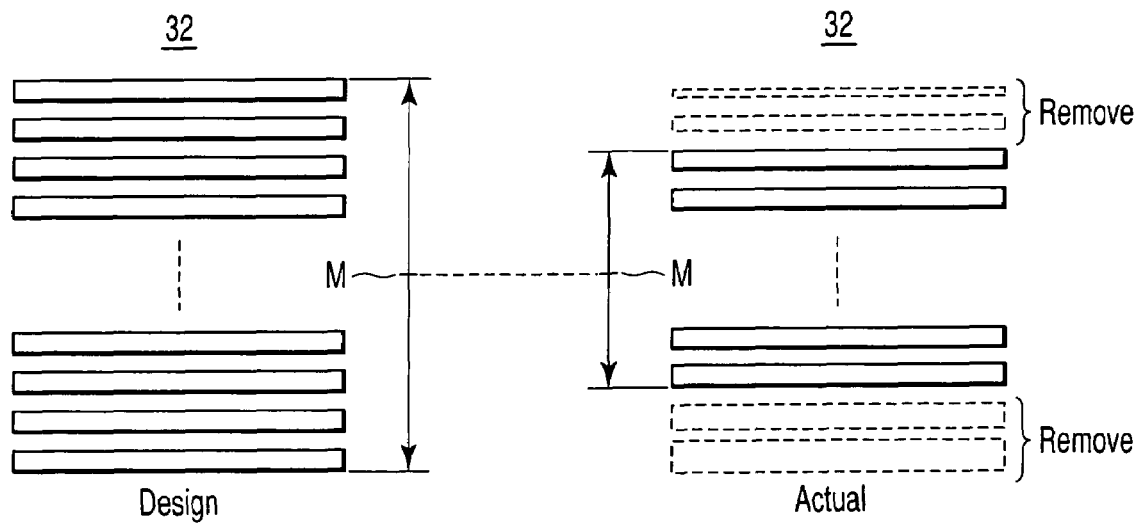

The first method for forming a misalignment inspection mark according to the embodiment of the present invention enables the selective removal of the processing patterns 320a and 326a from the boundaries (edges) of each of the second marks (second mark areas) 32a, 32b, 32c, and 32d. This avoids a possible defective pattern resulting from the discontinuity of periodicity or uniformity of the fine patterns at the edges. Misalignment inspections are thus possible which more precisely reflect the actual device pattern. An example is shown in FIGS. 18A and 18B. FIG. 18A shows an example in which the processing patterns at the boundaries of the second mark area 32 are not removed. In this case, the periodicity of the fine patterns is discontinued at the boundaries, so that the fine patterns at the boundaries have a width smaller or larger than a designed one. A misalignment amount ΔM occurs between the designed center point M of the second mark area 32 and the actual center point M'. This misalignment amount may reduce the accuracy of the misalignment inspections.

In contrast, FIG. 18B shows an example in which the processing patterns are removed from the boundaries of the second mark area 32. This example involves no fine patterns located at the boundaries which would otherwise have a width smaller or larger than the designed one. This makes it possible to more accurately align the designed center point M of the second mark area 32 with the actual center point M'. Therefore, as in the case of the above embodiment, removal of the processing patterns from the boundaries advantageously increases the accuracy of the misalignment inspections compared to the avoidance of the removal.

In the first method for forming a misalignment inspection mark according to the embodiment of the present invention, the misalignment inspection mark includes a part of the device pattern or an equivalent pattern. Consequently, the misalignment inspection mark suffers an error resulting from the effect of aberration of the projection optical system used for pattern transfer which error is equivalent to that to which the device pattern is subjected. Both patterns thus have the same misalignment amount. Accordingly, the first method for forming a misalignment inspection mark according to the embodiment of the present invention is expected to accomplish accurate alignment to enable accurate overlay patterning error measurements. Further, if the device pattern includes at least two types of patterns with different shapes, this method enables accurate alignment even if the misalignment amount resulting from, for example, the aberration of the projection optical system varies between the patterns.

Wet development using a developer has been described by way of example. However, the present invention is of course applicable to dry development using plasma reaction or the like.

(Second Method for Forming a Misalignment Inspection Mark)

With reference to FIGS. 6 and 11 to 15, description will be given of a method (second formation method) for forming a misalignment inspection mark according to the embodiment of the present invention. As is the case with the first formation method, the method for forming a misalignment inspection mark described below is illustrative and not only can be varied as described below but can also be implemented in various other ways. Similarly, the disclosed mask pattern is illustrative and various other mask patterns can of course be used.

Figure 11:
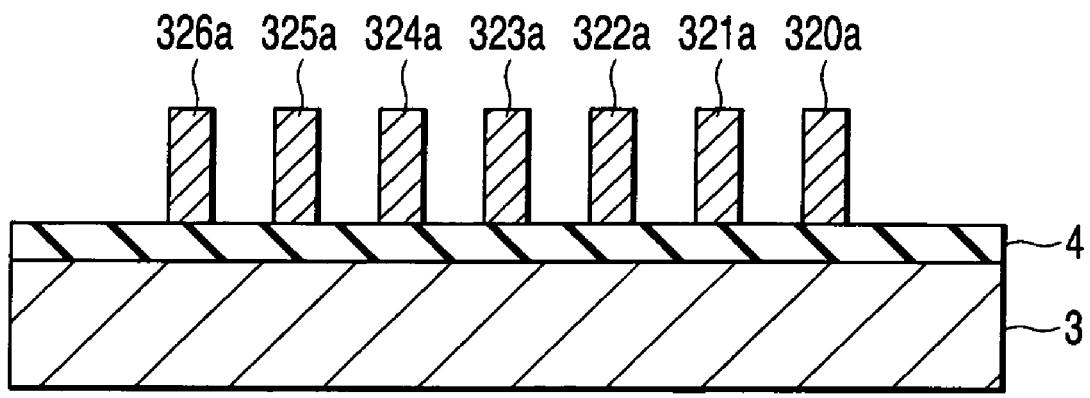
FIG. 11 is a schematic sectional view illustrating a step of a second method for forming a misalignment inspection mark according to the embodiment of the present invention.

(A) First, as described in the first formation method, the first marks (groove portions) 31a and 31c constituting a reference layer (first layer) are formed in the surface of the semiconductor substrate (Si substrate) 3 as shown in FIG. 6 (in a plan view, the 4 first marks (groove portions) 31a, 31b, 31c, and 31d which are separate from and orthogonal to one another are formed as shown in FIG. 3). In this case, the reference layer device pattern is formed in the chip area in the reference layer. An insulating film (SiO$_2$ film) 4 of thickness 10 to 30 nm is then formed on the surface of the semiconductor substrate 3 as a first non-photosensitive film by means of a thermal oxidation or chemical vapor deposition (CVD) process. In the present specification, the term "non-photosensitive film" is used in contrast to a photosensitive film such as a resist film which has a molecular structure that is changed by photoreaction. A polycrystalline silicon layer of thickness 100 to 200 nm is subsequently deposited on the insulating film 4 as a second non-photosensitive film by means of the CVD process. A resist (positive resist) is further spin coated all over the surface of the polycrystalline silicon layer to form a new resist film. Then, as in the case of the first formation method, the first inspection mask (inspection reticle) is used to expose the resist film by projecting the four second mark areas (second mark areas) 32a, 32b, 32c, and 32d in the overlying layer (second layer) on the resist film so that the marks 32a, 32b, 32c, and 32d are reduced and align with the rectangular area surrounded by the 4 first marks (groove portions) 31a, 31b, 31c, and 31d, as shown in the plan view in FIG. 3. Specifically, the patterns of the four second marks (second mark areas) 32a, 32b, 32c, and 32d have the same size, pitch (periodicity), and pattern density as those of the overlying layer device pattern 35 in the chip area. This resist film is used as an etching mask to etch the second non-photosensitive film (polycrystalline silicon layer) by means of the RIE process to expose a part of the insulating film 4. The processing patterns 320a, 321a, 322a, . . . , 326a are thus formed which consist of the second non-photosensitive film (polycrystalline silicon layer) having such a sectional shape as shown in FIG. 11.

Figure 12:
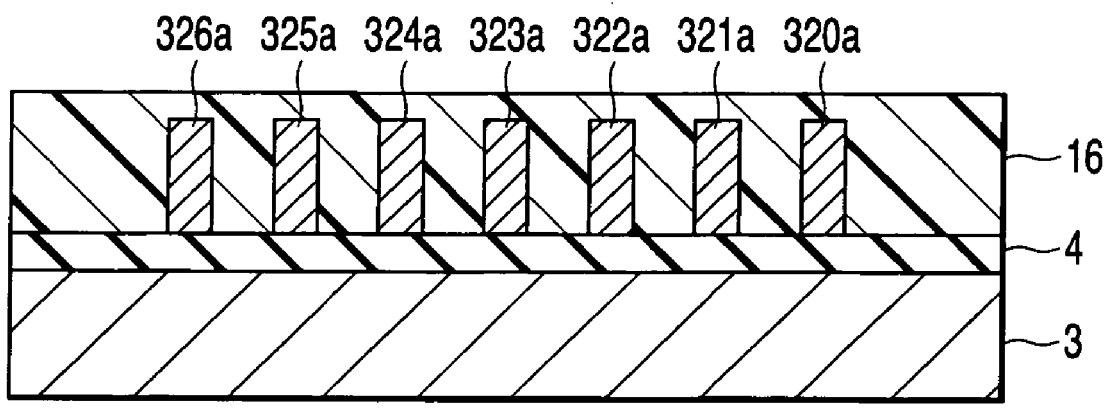
FIG. 12 is a schematic sectional view illustrating a step of the second method for forming a misalignment inspection mark according to the embodiment of the present invention.
Figure 13:
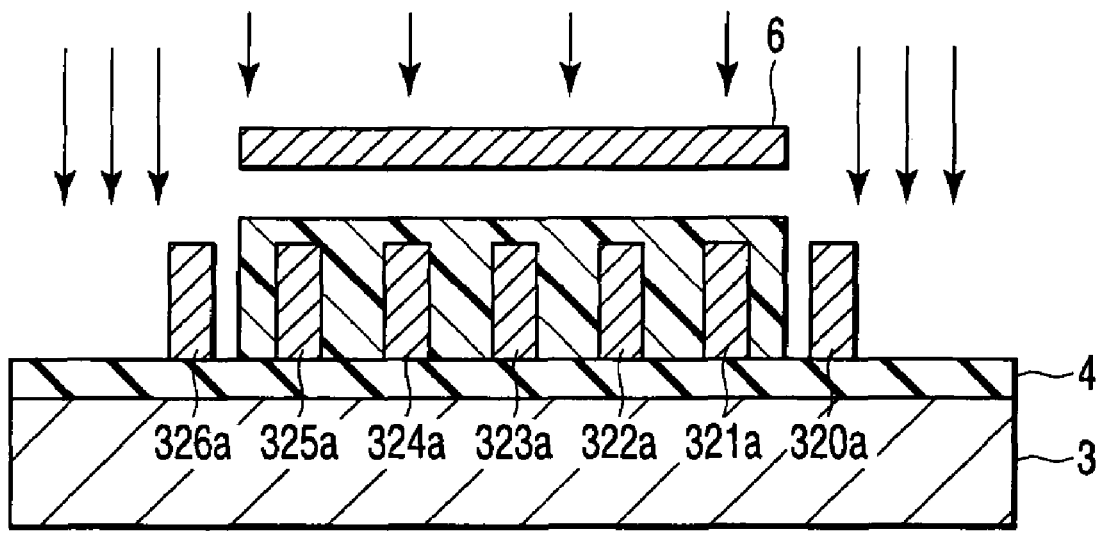
FIG. 13 is a schematic sectional view illustrating a step of the second method for forming a misalignment inspection mark according to the embodiment of the present invention.

(B) Then, as shown in FIG. 12, a new resist film 16 is spin coated all over the surface. A second inspection mask (inspection reticle) is then used to selectively expose the boundary (edge) of each of the 4 second marks (second mark areas) 32a, 32b, 32c, and 32d. The second mark (second mark area) 32a will be described by way of example. As shown in FIG. 13, only the processing patterns 320a and 326a, located at the opposite ends, are exposed from the resist film 16. That is, the second inspection mask (inspection reticle) has such a shielding film 6 as covers the positions of the processing patterns 321a, 322a, 323a, 324a, and 325a so that the resist film 16 remains on the processing patterns 321a, 322a, 323a, 324a, and 325a. A lithography process using the second inspection mask (inspection reticle) allows only the processing patterns 320a and 326a, located at the opposite ends, to be exposed from the resist film 16.

Figure 14:
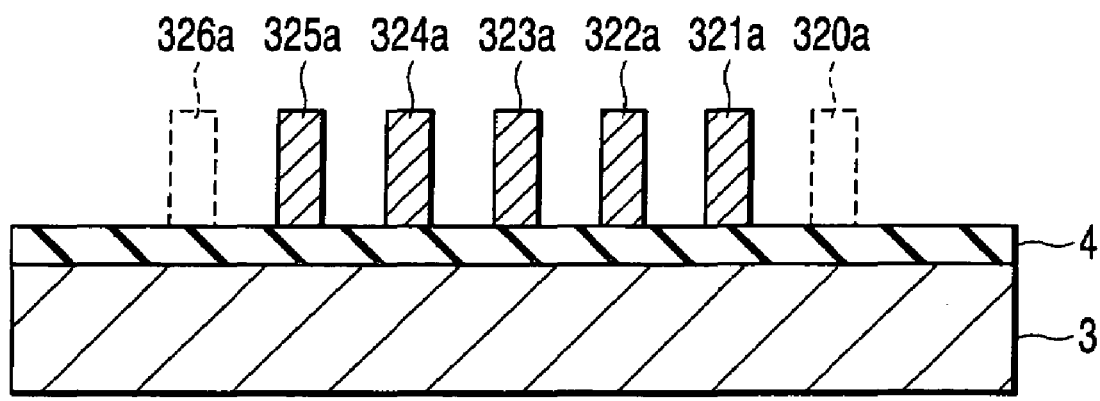
FIG. 14 is a schematic sectional view illustrating a step of the second method for forming a misalignment inspection mark according to the embodiment of the present invention.

(C) Thus, the subsequent additional RIE process removes the processing patterns 320a and 326a, located at the opposite ends, as shown in FIG. 14.

The second method for forming a misalignment inspection mark according to the embodiment of the present invention enables the selective removal of the processing patterns 320a and 326a from the boundaries (edges) of each of the second marks (second mark areas) 32a, 32b, 32c, and 32d. This avoids a possible defective pattern resulting from the discontinuity of periodicity or uniformity of the fine patterns at the edges. Misalignment inspections are thus possible which more precisely reflect the actual device pattern. That is, in the first method for forming a misalignment inspection mark according to the embodiment of the present invention, the misalignment inspection mark includes a part of the device pattern or an equivalent pattern. Consequently, the misalignment inspection mark suffers an error resulting from the effect of aberration of the projection optical system used for pattern transfer which error is equivalent to that to which the device pattern is subjected. Both patterns thus have the same misalignment amount. Accordingly, the second method for forming a misalignment inspection mark according to the embodiment of the present invention is expected to accomplish accurate alignment to enable accurate overlay patterning error measurements. Further, if the device pattern includes at least two types of patterns with different shapes, this method enables accurate alignment even if the misalignment amount resulting from, for example, the aberration of the projection optical system varies between the patterns.

(Method for Manufacturing a Semiconductor Device)

Figure 15:
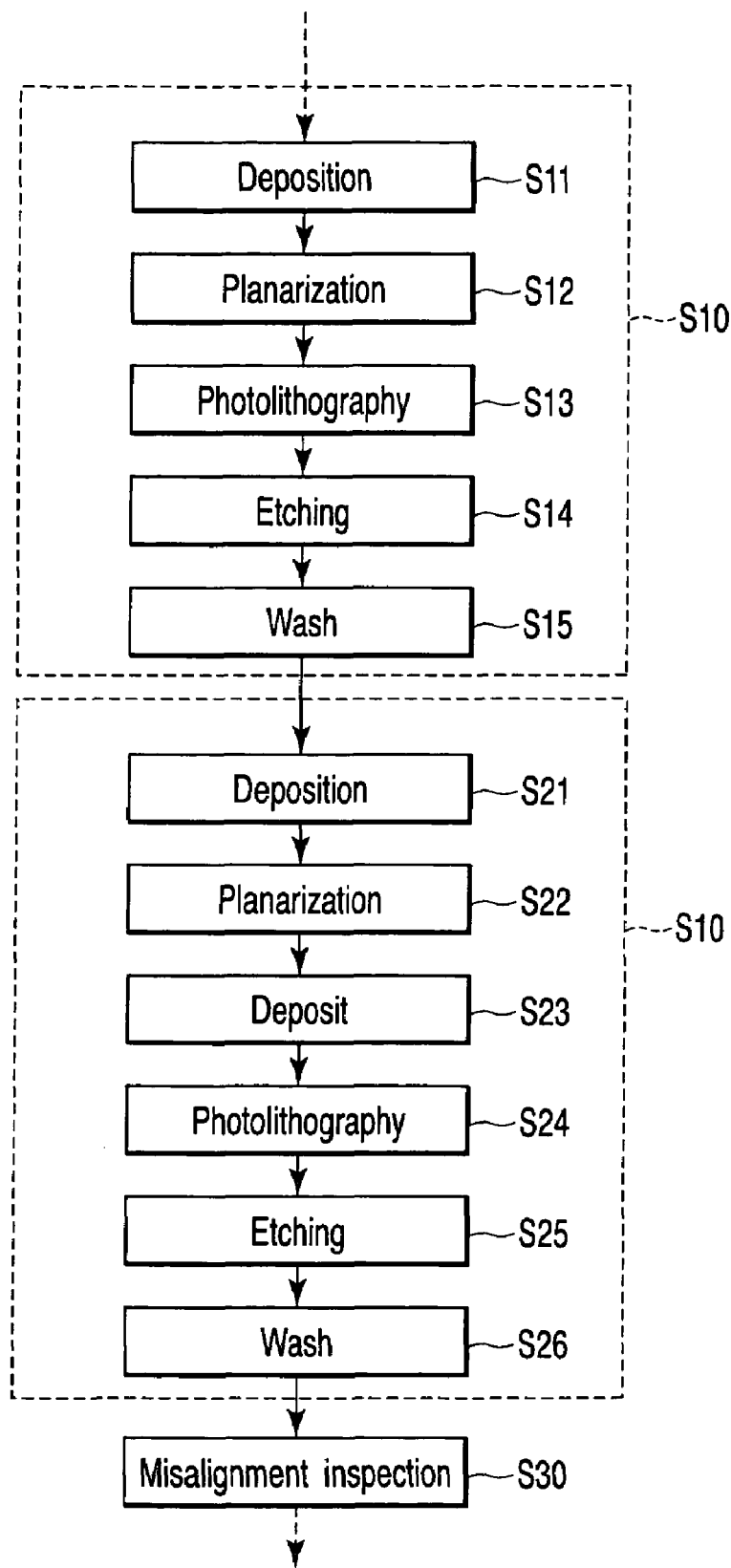
FIG. 15 is a flowchart illustrating a method for manufacturing a semiconductor device according to the embodiment of the present invention.

With reference to the flowchart in FIG. 15, description will be given of a method for manufacturing a semiconductor device according to the embodiment of the present invention. The method described below corresponds to only a part of the series of operations of a complicated method for manufacturing a semiconductor device, that is, steps S10, S20, and S30; the method will thus be illustratively described. The method not only can be varied as described below but can also be implemented in various other ways. In the description below, for convenience, the flowchart in FIG. 15 will be described in association with a part of a method for manufacturing a NAND type flash memory. However, of course, the present invention is not limited to the method for manufacturing a NAND type flash memory. For simplification, it is assumed that the steps ending with patterning of word lines of the NAND type flash memory is finished before step S11 in the flowchart in FIG. 15. Specifically, the following steps have already been finished. An active area (AA) is formed which is surrounded by an isolative insulating film of STI. A gate insulating film (tunnel oxide film), a first conductive film (floating gate electrode), an inter-conductive-layer insulating film, and a second conductive layer (control gate electrode) are sequentially stacked in the active area. The photolithography technique is used to etch the second conductive layer (control gate electrode), inter-conductive-layer insulating film, and first conductive layer (floating gate electrode) by means of RIE. Memory cell transistors in each memory cell column are separated from one another. The word lines are patterned.

(A) Once the word line patterning step is finished, the following steps are executed on the semiconductor substrate 3: implantation of ions in a source/drain diffusion layer in each memory cell transistor and implantation of ions in a contact diffusion layer. Further, with the dose of ions changed, ion implantation is carried out on the source/drain diffusion layer and contact diffusion layer in each of the transistors in a peripheral circuit. Then in step S11, a high-density plasma (HDP) process using diflorosilane (SiH$_2$F$_2$) is executed to deposit an SiOF film of thickness about 10 nm which serves as a column-wise cell isolative insulating film (interlayer insulating film). The film is thus buried in cell separation grooves that separate memory cell transistor from select transistors. A plasma source for the HDP process may be, for example, inductively coupled plasma (ICP) or the like. Etch-back is then carried out by means of the RIE process to remove the column-wise cell isolative insulating film (interlayer insulating film) 24. A silicon oxide film, a silicon oxynitride film, or a barrier insulating film consisting of an aluminum oxide film is deposited all over the surface to a thickness of 10 to 1,000 nm so as to contain the memory cell transistors and select transistors. The barrier insulating film is an etching stopper that prevents excessive etching during formation of openings for source line contacts CS and data transfer line contacts CB. A barrier insulating film which etches the interlayer insulating film at a lower speed to offer an appropriate selection ratio is used as a stopper for etching. The barrier insulating film is subsequently removed by etching. This makes it possible to prevent the excessive etching of the semiconductor substrate 3 during formation of openings for the source line contacts CS and data transfer line contacts CB. Alternatively, before the deposition of the barrier insulating film, a silicon insulating film of thickness 1 to 50 nm may be formed on the surface of the semiconductor substrate 3 by an oxidation or deposition process. An interlayer insulating film is then deposited on the barrier insulating film to a thickness of 10 to 1,000 nm; the interlayer insulating film consists of a silicon insulating film, a silicon nitride film, silicate glass such as BPSG or PSG, HSQ or MSQ, or an insulating film of an organic polymer or the like with an aromatic hydrocarbon structure containing no fluorine.

(B) In step S12, the surface of the interlayer insulating film is flattened by chemical mechanical polishing (CMP) or the like. Then in step S13, a resist mask on the interlayer insulating film is formed by the photolithography technique. In step S14, the resist mask is used as an etching mask to anisotropically etch the interlayer insulating film in the chip area in the reference layer. This forms openings for the data transfer line contacts CB and source line contacts CS constituting a reference layer device pattern. The flow from step S13 to step S14 forms openings (groove portions) corresponding to the first marks 31a and 31c in the reference layer as is the case with FIG. 6. Subsequently in step S15, the resist as an etching mask is removed, and the semiconductor substrate 3 is washed. After the removal of the resist in step S15, the barrier insulating film is etched away from the bottom of each of the openings of the data transfer line contacts CB and source line contacts CS. The semiconductor substrate 3 is partly exposed from the bottom of each of the openings of the data transfer line contacts CB and source line contacts CS (the flow from step S11 to S15 patterns the reference layer shown in step S10 in FIG. 15).

(C) Subsequently in step S21, polycrystalline silicon is deposited in the openings of the data transfer line contacts CB and source line contacts CS by the CVD process; the polycrystalline silicon is doped with n-type impurities, for example, phosphorous (P) or arsenic (As), at high concentration. The polycrystalline silicon is buried in the openings as a burial material. In step S22, a part of surface of the burial material is etched back by anisotropic etching such as chemical dry etching (CDE) or flattened by CMP or the like.

(D) In step S23, a metal material such as aluminum (Al) is deposited all over the interlayer insulating film to a thickness of 10 to 1,000 nm. In step S24, the patterns of plural striped data transfer lines extending in a direction orthogonal to the word lines are formed into an overlying layer device pattern in the chip area in the overlying layer by means of the photolithography technique. On this occasion, as shown in FIG. 7, the first inspection mask (inspection reticle) is used to form four second marks (second mark areas) 32a, 32b, 32c, and 32d in the overlying layer. Specifically, the patterns of the four second marks (second mark areas) 32a, 32b, 32c, and 32d have the same size, pitch (periodicity), and pattern density as those of the patterns of the data transfer lines. The second inspection mask (inspection reticle) is subsequently used to doubly expose the boundaries (edges) of each of the four second marks (second mark areas) 32a, 32b, 32c, and 32d, as is the case with FIG. 9. In other words, as shown in FIG. 9, only the processing patterns 320a and 326a, located at the opposite ends, are selectively doubly exposed. In this case, the second inspection mask (inspection reticle) has the shielding film 6 that avoids exposing the overlying layer device pattern in the chip area and the processing patterns 321a, 322a, 323a, 324a, and 325a in the second mark (second mark area) 32a. The double exposure facilitates the selective photolytic reaction of only the processing patterns 320a and 326a, located at the opposite ends. The molecular structure of the processing patterns 320a and 326a is thus modified to melt in a developer. Thus, the subsequent development process removes the processing patterns 320a and 326a, located at the opposite ends, as shown in FIG. 10.

(E) In step S25, the patterned resist is used as an etching mask to selectively etch the metal film by RIE to form striped data transfer lines. At the same time, the patterns of the four second marks (second mark areas) 32a, 32b, 32c, and 32d are formed. Subsequently in step S26, the resist as an etching mask is removed, and the semiconductor substrate 3 is washed (the flow from step S21 to S26 patterns the overlying layer shown in step S20 in FIG. 15).

Figure 16:
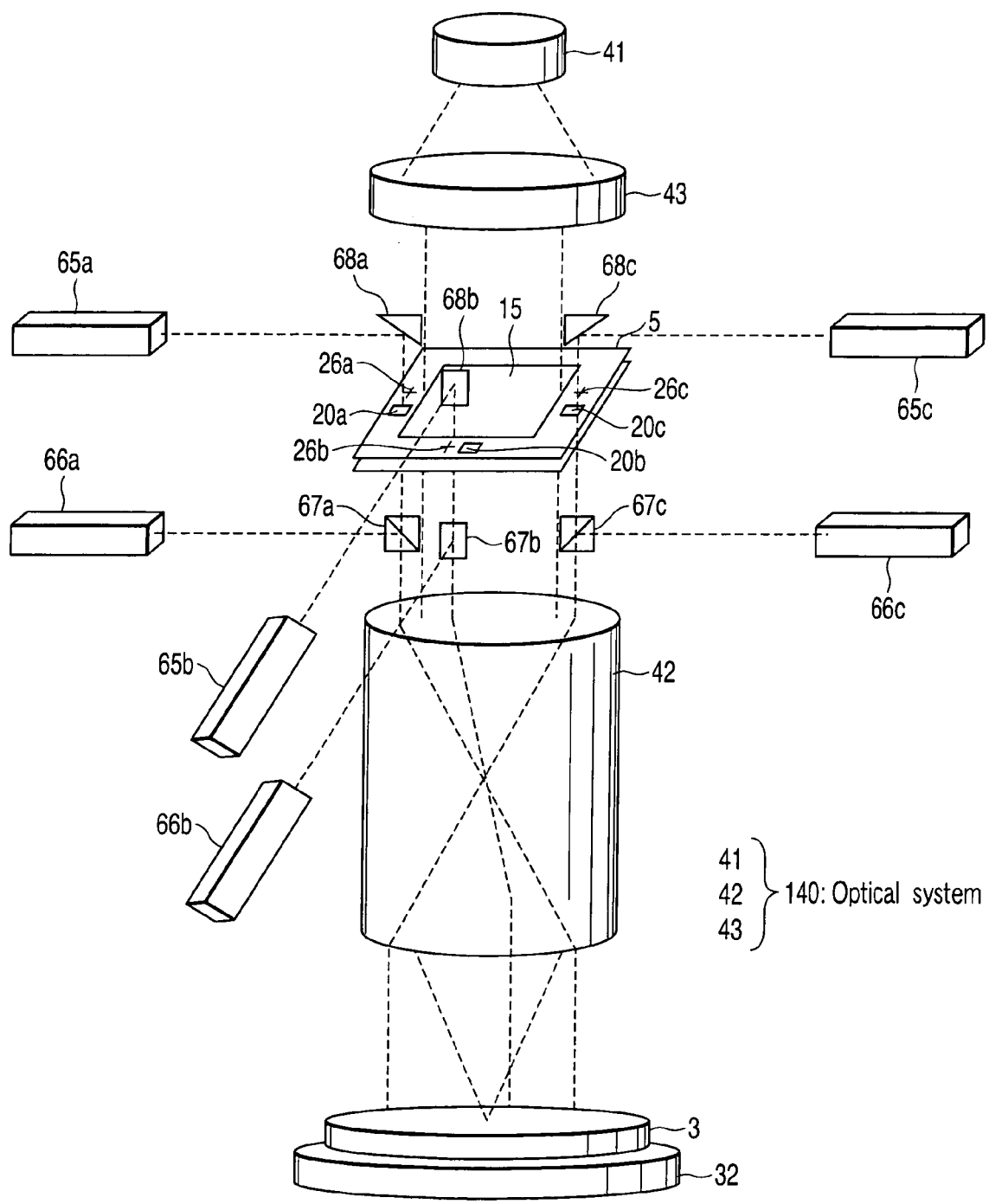
FIG. 16 is a schematic diagram showing a reduced projection exposure apparatus comprising a misalignment inspection optical system in the method for manufacturing a semiconductor device according to the embodiment of the present invention.

(F) Subsequently in step S30, misalignment inspections are carried out using the four first marks 31a, 31b, 31c, and 31d and 4 second marks (second mark areas) 32a, 32b, 32c, and 32d. The misalignment inspections may be carried out using an optical microscope such as a laser microscope, or a scanning electron microscope (SEM), or an inspection optical system incorporated into such a reduced projection exposure apparatus as shown in FIG. 16. In this figure, the apparatus comprises not only the components of the reduced projection exposure apparatus shown in FIG. 1 but also an inspection optical system having an inspection laser oscillator 65a, a reflector 68a that guides laser light emitted by the inspection laser oscillator 65a to the misalignment inspection mark 20a and alignment mark 26a on the reticle 5, a beam splitter 67a placed below the reticle 5, and a TTL sensor 66a that receives laser beams into which the laser light has been split by the beam splitter 67a. In FIG. 16, the laser light emitted by the inspection laser oscillator 65a has a wavelength beyond the sensitivity of the resist film coated on the semiconductor substrate 3. The laser light is then guided to the misalignment inspection mark 20a and alignment mark 26a on the reticle 5 by means of the reflector 68a. The laser light transmitted through the misalignment inspection mark 20a and alignment mark 26a impinges on the surface of the semiconductor substrate 3 via the beam splitter 67a and projection optical system 42. Images of the misalignment inspection mark 20a and alignment mark 26a are projected on the surface of the semiconductor substrate 3 and sensed by the TTL sensor 66a via the beam splitter 67a. An inspection optical system is also provided for the inspection pattern 20b and alignment mark 26b; the inspection optical system comprises an inspection laser oscillator 65b, a reflector 68b, a beam splitter 67b, and a TTL sensor 66b. An inspection optical system is also provided for the inspection pattern 20c and alignment mark 26c; the inspection optical system comprises an inspection laser oscillator 65c, a reflector 68c, a beam splitter 67c, and a TTL sensor 66c. For example, the arrangement of the other components of the reduced projection exposure apparatus shown in FIG. 16 is similar to that shown in FIG. 1 and will not be described.

The method for manufacturing a semiconductor device according to the embodiment of the present invention enables the selective removal of the processing patterns 320a and 326a from the boundaries (edges) of each of the second marks (second mark areas) 32a, 32b, 32c, and 32d. This avoids a possible defective pattern resulting from the discontinuity of periodicity or uniformity of the fine patterns at the edges. Semiconductor devices can thus be manufactured with an increased processing accuracy, with misalignment inspections carried out so as to more precisely reflect the actual device pattern. That is, in the method for manufacturing a semiconductor device according to the embodiment of the present invention, the misalignment inspection mark includes a part of the device pattern or an equivalent pattern. Consequently, the misalignment inspection mark suffers an error resulting from the effect of aberration of the projection optical system used for pattern transfer which error is equivalent to that to which the device pattern is subjected. Both patterns thus have the same misalignment amount. Accordingly, the method for manufacturing a semiconductor device according to the embodiment of the present invention is expected to accomplish accurate alignment to enable accurate overlay patterning error measurements. Further, if the device pattern includes at least two types of patterns with different shapes, this method enables accurate alignment even if the misalignment amount resulting from, for example, the aberration of the projection optical system varies between the patterns.

In the description of the above example, the method for manufacturing a semiconductor device according to the embodiment of the present invention uses the first method for forming a misalignment inspection mark according to the embodiment of the present invention. However, the method for manufacturing a semiconductor device according to the embodiment of the present invention uses the second method for forming a misalignment inspection mark according to the embodiment of the present invention. In this case, in the photolithography operation in step S24, the second marks (second mark areas) 32a, 32b, 32c, 32c, and 32d are formed in the resist film using the second inspection mask (inspection reticle) having the same size, pitch (periodicity), and pattern density as those of the patterns of the data transfer lines. In step S25, simultaneously with the performance of RIE on the patterns of the data transfer lines, the second marks (second mark areas) 32a, 32b, 32c, 32c, and 32d are patterned by RIE. In step S23, the resist as an etching mask is removed, and the semiconductor substrate 3 is washed. Then, as described with reference to FIG. 12 top 14, a new resist film 16 is spin coated all over the surface. The second inspection mask (inspection reticle) is then used to selectively expose the boundaries (edges) of each of the second marks (second mark areas) 32a, 32b, 32c, and 32d. Specifically, as shown in FIG. 13, only the processing patterns 320a and 326a, located at the opposite ends, are exposed from the resist film 16. An additional RIE step is subsequently executed to remove the processing patterns 320a and 326a, located at the opposite ends, as shown in FIG. 14. Then, as is the case with step S23, the resist as an etching mask is removed, and the semiconductor substrate 3 is washed. Subsequently in step S30, misalignment inspections may be carried out using the 4 first marks 31a, 31b, 31c, and 31d and four second marks (second mark areas) 32a, 32b, 32c, and 32d.

Other Embodiments

The present invention has been described in conduction with the above embodiment. However, it should not be interpreted that the statements and drawings constituting a part of the present disclosure limit the present invention. Various alternative embodiments, examples, and operating techniques will be apparent to those skilled in the art after reading the present disclosure.

The embodiment of the present invention can provide a method for forming a misalignment inspection mark and a method for manufacturing a semiconductor device using the misalignment inspection, the methods equalizing the transfer position misalignment amount between each misalignment inspection mark and device pattern both formed on the semiconductor substrate to improve the measurement accuracy of the misalignment inspection.

For example, as already described, the overlying layer (second layer) need not necessarily be located immediately above the reference layer (first layer) but another layer may be interposed between these layers. Accordingly, in the flowchart shown in FIG. 15 and illustrating the method for manufacturing a semiconductor device, a step of depositing another insulating layer or conductive layer or etching this layer may be interposed between steps 15 and 21. In the present specification, the reference layer (first layer) and overlying layer (second layer) have only to be in a logically aligned relationship.

Like the second mark, the first mark may be formed of an arrangement of fine patterns consisting of an arrangement of plural patterns having a line width, a pitch, and a pattern density at least one of which is equivalent to that of the reference layer device pattern. That is, as is the case with the formation of a second mark, a first mark area can be formed adjacent to the reference layer device pattern; the first mark area consists of an arrangement of plural patterns having a line width, a pitch, and a pattern density at least one of which is equivalent to that of the reference layer device pattern. The patterns arranged at the boundaries of the first mark area are removed. The remaining patterns are used to form first marks.

Thus, the present invention of course includes various embodiments or the like not described in the present specification. Therefore, the technical scope of the present invention is determined only by invention specifying matters according to the appropriate claims based on the above description.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a misalignment inspection mark, the method comprising:

forming, in a reference layer, a reference layer device pattern and at least one first mark present on the same layer as that of the reference layer device pattern;

forming an overlying layer device pattern and at least one second mark area in a layer over the reference layer adjacent to the at least one first mark, the overlying layer device pattern corresponding to the reference layer, the second mark area being present in the same layer as that of the overlying layer device pattern and including an arrangement of a plurality of first mark patterns having a line width, a pitch, and a pattern density at least one of which is equivalent to that of the overlying layer device pattern, wherein the first mark patterns comprises a plurality of first patterns arranged at ends of the second mark area and a plurality of second patterns; and removing the first patterns and using the second patterns to form at least one second mark.

2. The method for forming a misalignment inspection mark according to claim 1, wherein the arrangement of the plurality of first mark patterns in the second mark area is formed into patterns on a photosensitive film, and the first patterns on the photosensitive film are doubly exposed to remove the first patterns on the photosensitive film to form the second mark using the second patterns.

3. The method for forming a misalignment inspection mark according to claim 1, wherein the arrangement of the plurality of patterns in the second mark area is formed into patterns on a non-photosensitive film, and a lithography step and an etching step are executed to remove the patterns on the non-photosensitive film which are arranged at the boundaries to form the second mark.

4. The method for forming a misalignment inspection mark according to claim 1, wherein the reference layer is a semiconductor substrate, and the first mark and the second mark are arranged on a dicing line on the semiconductor substrate.

5. The method for forming a misalignment inspection mark according to claim 1, wherein four of the first mark are provided, and the four first marks are arranged in association with the positions of four sides of a rectangle, and four of the second mark are provided, and each of the four second marks is placed adjacent to the corresponding one of the four first marks.

6. The method for forming a misalignment inspection mark according to claim 5, wherein the four second marks are arranged inside the four first marks.

7. The method for forming a misalignment inspection mark according to claim 1, wherein the four first marks and the four second marks are used to inspect the reference layer device pattern and the overlying layer device pattern for misalignment on the basis of a difference between the position of the at least one first mark and the position of the at least one second mark.

8. The method for forming a misalignment inspection mark according to claim 5, wherein the four first marks and the four second marks are used to inspect the reference layer device pattern and the overlying layer device pattern for misalignment on the basis of a difference between the center of gravity of a rectangle formed of the four first marks and the center of gravity of a rectangle formed of the four second marks.

9. The method for forming a misalignment inspection mark according to claim 1, wherein the at least one first mark is formed by:

forming at least one first mark area in the same layer as that of the reference layer device pattern, the first mark area including an arrangement of a plurality of second mark patterns having a line width, a pitch, and a pattern density at least one of which is equivalent to that of the reference layer device pattern, wherein the plurality of patterns comprises a plurality of third patterns arranged at ends of the first mark area and a plurality of fourth patterns; and removing the third patterns and using the fourth patterns to form at least one first mark.

10. A method for manufacturing a semiconductor device, the method comprising:

forming, in a reference layer on a semiconductor substrate, a reference layer device pattern and at least one first mark present on the same layer as that of the reference layer device pattern;

forming an overlying layer device pattern and at least one second mark area in a layer over the reference layer adjacent to the at least one first mark, the overlying layer device pattern corresponding to the reference layer, the second mark area being present in the same layer as that of the overlying layer device pattern and including an arrangement of a plurality of first mark patterns having a line width, a pitch, and a pattern density at least one of which is equivalent to that of the overlying layer device pattern, wherein the first mark patterns comprises a plurality of first patterns arranged at ends of the second mark area and a plurality of second patterns;

removing the first patterns and using the second patterns to form at least one second mark;

using the first and second marks to inspect the reference layer device pattern and the overlying layer device pattern for misalignment; and if the inspection indicates that the amount of misalignment is within an allowable range, advancing to a process of processing a device pattern located over the overlying device pattern.

11. The method for manufacturing a semiconductor device according to claim 10, wherein the arrangement of the plurality of first mark patterns in the second mark area is formed into patterns on a photosensitive film, and the first patterns on the photosensitive film are doubly exposed to remove the first patterns on the photosensitive film to form the second mark using the second patterns.

12. The method for manufacturing a semiconductor device according to claim 1, wherein the arrangement of the plurality of patterns in the second mark area is formed into patterns on a non-photosensitive film, and a lithography step and an etching step are executed to remove the patterns on the non-photosensitive film which are arranged at the boundaries to form the second mark.

13. The method for manufacturing a semiconductor device according to claim 10, wherein the reference layer is a semiconductor substrate, and the first mark and the second mark are arranged on a dicing line on the semiconductor substrate.

14. The method for manufacturing a semiconductor device according to claim 10, wherein four of the first mark are provided, and the four first marks are arranged in association with the positions of four sides of a rectangle, and four of the second mark are provided, and each of the four second marks is placed adjacent to the corresponding one of the four first marks.

15. The method for manufacturing a semiconductor device according to claim 14, wherein the four second marks are arranged inside the four first marks.

16. The method for manufacturing a semiconductor device according to claim 10, wherein the four first marks and the four second marks are used to inspect the reference layer device pattern and the overlying layer device pattern for misalignment on the basis of a difference between the position of the at least one first mark and the position of the at least one second mark.

17. The method for manufacturing a semiconductor device according to claim 14, wherein the four first marks and the four second marks are used to inspect the reference layer device pattern and the overlying layer device pattern for misalignment on the basis of a difference between the center of gravity of a rectangle formed of the four first marks and the center of gravity of a rectangle formed of the four second marks.

18. The method for manufacturing a semiconductor device according to claim 10, wherein the at least one first mark is formed by:

forming at least one first mark area in the same layer as that of the reference layer device pattern, the first mark area including an arrangement of a plurality of patterns having a line width, a pitch, and a pattern density at least one of which is equivalent to that of the reference layer device pattern, and removing those of the patterns which are arranged at boundaries of the first mark area and using the remaining patterns to form at least one first mark.

* * * * *